United States Patent
Hunter et al.

(10) Patent No.: US 10,826,477 B2
(45) Date of Patent: Nov. 3, 2020

(54) PROGRAMMABLE TIME-DIVISION MULTIPLEXED COMPARATOR

(71) Applicant: Texas Instruments Incorporated, Dallas, TX (US)

(72) Inventors: Bradford Lawrence Hunter, Spicewood, TX (US); Timothy F. Murphy, Ramona, CA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 16/664,346

(22) Filed: Oct. 25, 2019

(65) Prior Publication Data

US 2020/0059227 A1 Feb. 20, 2020

Related U.S. Application Data

(63) Continuation of application No. 16/046,832, filed on Jul. 26, 2018, now Pat. No. 10,491,204.

(51) Int. Cl.
*H03K 5/24* (2006.01)

(52) U.S. Cl.
CPC .................................. *H03K 5/24* (2013.01)

(58) Field of Classification Search
None
See application file for complete search history.

(56) References Cited

U.S. PATENT DOCUMENTS

| | | | |
|---|---|---|---|
| 8,134,401 B2 | 3/2012 | Hunter et al. | |
| 8,604,797 B2 * | 12/2013 | Senriuchi | H01M 10/4207 324/429 |
| 8,618,806 B2 * | 12/2013 | Zhang | H01M 10/4207 324/434 |
| 8,901,937 B2 | 12/2014 | Kosic et al. | |
| 8,994,335 B2 * | 3/2015 | Tagami | H02J 7/0024 320/134 |
| 9,081,038 B2 * | 7/2015 | Spalding, Jr. | G01R 15/06 |
| 10,228,423 B2 * | 3/2019 | Yanagawa | G01R 31/3835 |
| 2009/0174411 A1 | 7/2009 | Yudahira et al. | |
| 2012/0313562 A1 * | 12/2012 | Murao | H02J 7/0021 318/139 |
| 2013/0241480 A1 | 9/2013 | Kirimoto et al. | |
| 2018/0183421 A1 | 6/2018 | Kargl et al. | |

FOREIGN PATENT DOCUMENTS

| | | |
|---|---|---|
| GB | 1389611 A | 7/2009 |
| JP | 2017198546 A | 11/2017 |

OTHER PUBLICATIONS

Search Report for PCT Application No. PCT/US19/43460, international search report dated Nov. 14, 2019, 3 pages.

* cited by examiner

*Primary Examiner* — Jeffery S Zweizig
(74) *Attorney, Agent, or Firm* — Lawrence J. Bassuk; Charles A. Brill; Frank D. Cimino

(57) ABSTRACT

A monitoring circuit is implemented for comparing a sampled voltage taken from a selected sampling capacitor and a reference voltage from a voltage buffer (150). The voltage buffer (150) is configurable according to programming provided to a programmable logic controller, PLC, (570). Comparisons may be made on a periodic basis, such as a time-division multiplexed basis, in connection with register settings in the PLC (570).

13 Claims, 4 Drawing Sheets

PROGRAMMABLE TIME-DIVISION MULTIPLEXED COMPARATOR

CROSS REFERENCE TO RELATED APPLICATIONS

Under 35 U.S.C. § 120, this continuation application claims benefits of and priority to U.S. patent application Ser. No. 16/046,832 (TI-79103), filed on Jul. 26, 2018, the entirety of which are hereby incorporated herein by reference

BACKGROUND

Power management integrated circuits often monitor many voltages toward a goal of power control. This includes making sure that voltages meet proper threshold levels. Each threshold may be determined using a comparator in conjunction with an internal reference voltage. However, providing a separate comparator for each voltage from a site of interest can use a lot of chip real estate as well as power. A single comparator may be implemented using a multiplexer to select among a variety of input voltages, on channels, against which a reference voltage may be compared. Channel, as used herein, refers to a network medium through which connection or communication may occur. Comparing voltages in connection with a strictly software approach may suffer from insufficient speed of operation. Such may also be the case in carrying out voltage comparisons in conjunction with using a microprocessor. A more hardware-oriented approach is needed to allow greater speed of operation, while minimizing chip real estate, in carrying out tasks involving voltage threshold maintenance.

SUMMARY

A monitoring circuit is provided that has a plurality of sampling capacitors and a plurality of switches, with each switch being coupled to a respective capacitor from the plurality of sampling capacitors. The monitoring circuit also includes a voltage buffer, configurable to output a voltage of a selected level. A programmable logic controller (PLC), is included in the monitoring circuit. The PLC is operable to configure the voltage buffer and select, using a switch from the plurality of switches, a sampling capacitor from the plurality of sampling capacitors. A comparator in the monitoring circuit is operable to compare voltages from a selected sampling capacitor and the voltage of the selected level from the voltage buffer. The PLC is configured to schedule, on a periodic basis, comparisons of voltage from the selected sampling capacitor with the voltage of the selected level from the voltage buffer.

BRIEF DESCRIPTION OF THE DRAWINGS

The ensuing description may be taken in connection with the accompanying drawings briefly described as follows.

Figure 1:
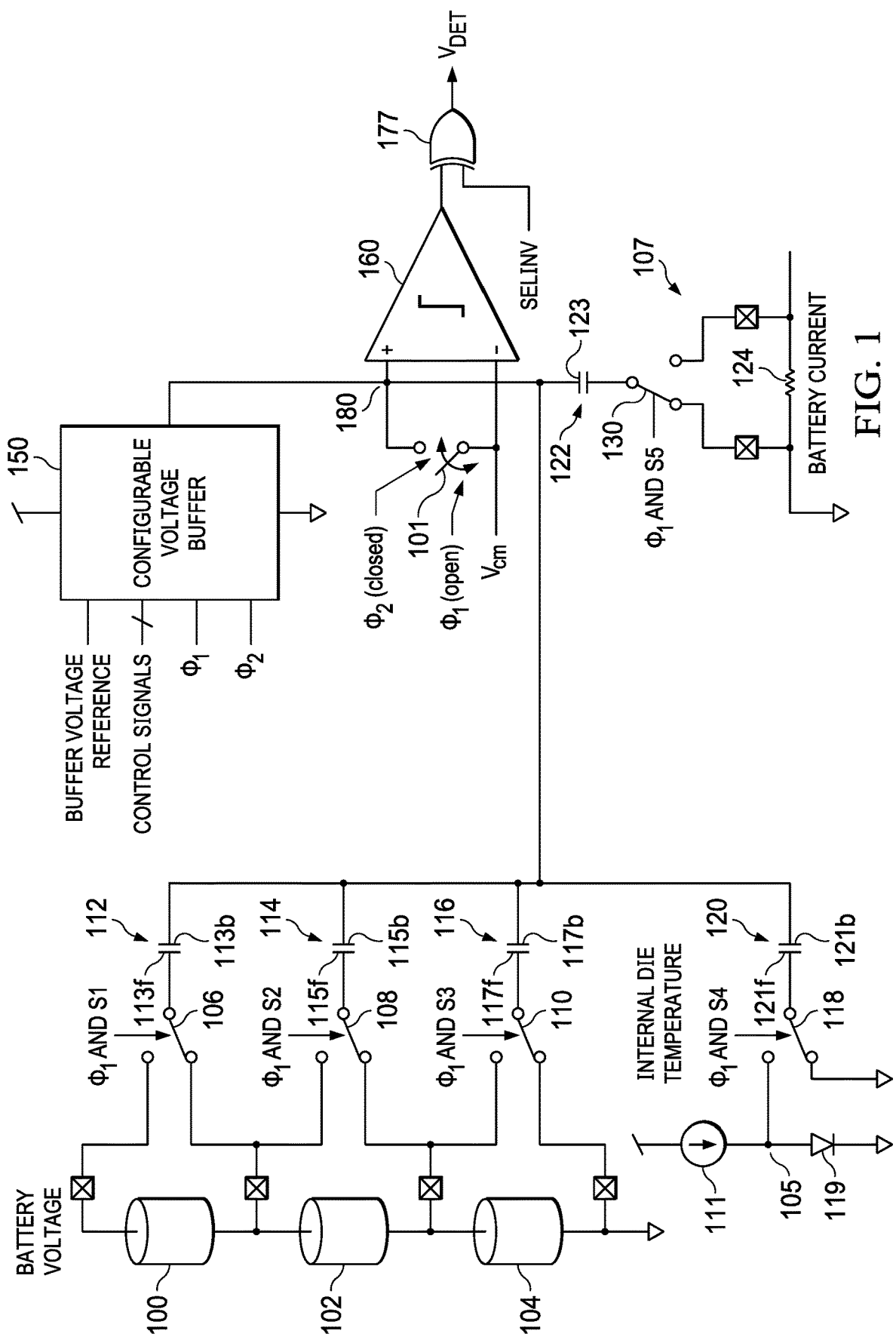
FIG. 1 is a diagram/schematic illustrating a circuit for monitoring several voltage thresholds for a variety of components on a periodic or aperiodic basis using a time-division multiplexed comparator.

Applicable reference numerals have been carried forward.

DETAILED DESCRIPTION

FIG. 1 is a schematic diagram illustrating a circuit for monitoring several voltage for a variety of components on a periodic or aperiodic basis using a comparator as described herein. Measurement of voltages from battery 100, battery 102, and battery 104 are selectable through switch 106, switch 108 and switch 110, respectively, in connection with transferring a selected voltage to a respective sampling capacitor 112, 114, 116, 120 or 122. The selection of the voltages for comparison may be accomplished through a channel selection, using a schedule timed according to a clock signal, (referenced herein as a timed schedule) in conjunction with a programable logic controller, in order to carry out programmable time-multiplexed or systematic voltage comparisons in a time-division multiplexed fashion. Time division multiplexing may refer to making selections (such as information, parameters, settings, etc.) which are to be in effect for only a fraction of time in an alternating pattern among the possible selections. For instance, comparison of the voltage output from battery 100 with a selected threshold voltage from configurable voltage buffer 150 may occur in connection with a microcontroller such as a programmable logic controller (not shown) making a corresponding channel selection on channels S1 (for battery 100), S2 (for battery 102) and S3 (for battery 104) with certain parameters being in effect as defined and specified by the programmable logic controller.

Configurable voltage buffer 150 generates a threshold voltage, as a standard for comparison, which is sent to the input of comparator 160. The voltage from the output of voltage buffer 150 is compared with the voltage, across a selected sampling capacitor 112, 114, 116, 120 or 122. The voltage of the selected sampling capacitor is representative of the voltage of concern to be compared with the threshold (that configured by voltage buffer 150). The output of comparator 160 may signal whether the voltage on the selected sampling capacitor is above or below the threshold voltage being output from configurable voltage buffer 150.

Figure 2:
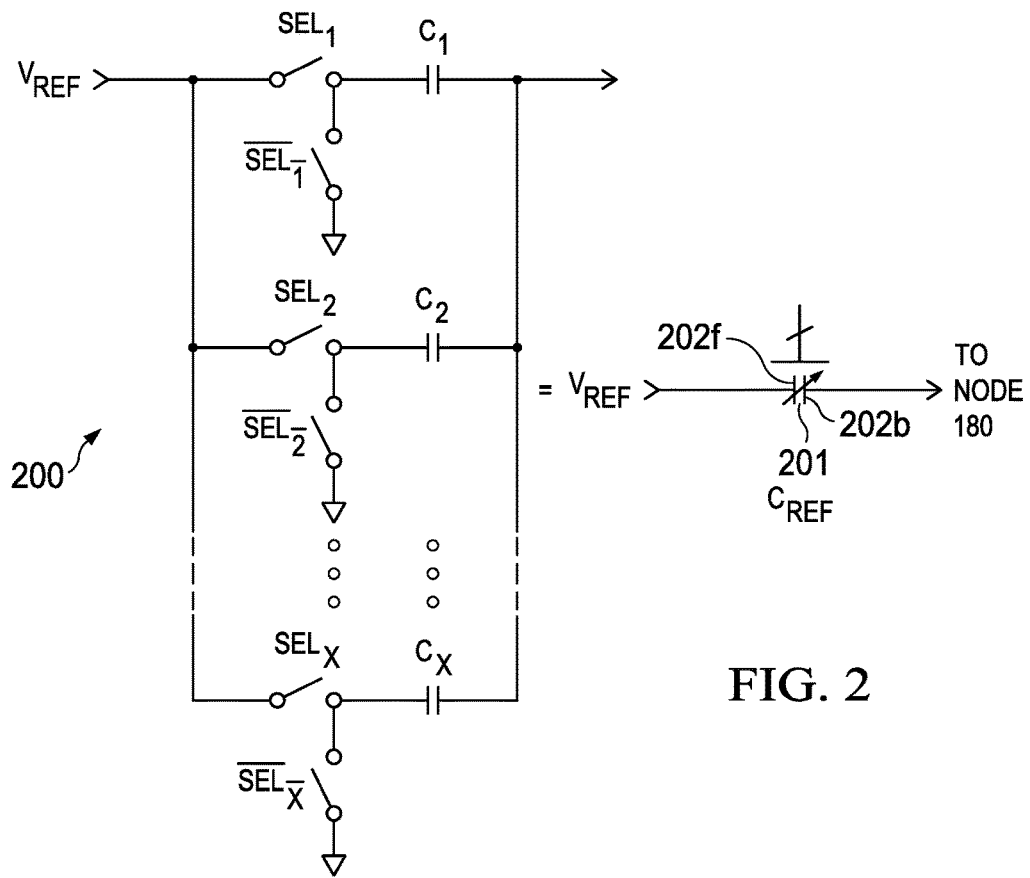
FIG. 2 illustrates capacitor matrix 200 having capacitors C, indexed from 1 through x (x being an integer), for and within a configurable voltage buffer.

FIG. 2 illustrates capacitor matrix 200 having capacitors C, indexed from 1 through x (x being an integer), for and within configurable voltage buffer 150 (shown in FIG. 1), through which voltages may be imparted to selected capacitors via correspondingly indexed switches $SEL_{1\ through\ x}$. Capacitor matrix 200 serves to produce a configurable capacitance for which an effective capacitor produces a threshold voltage providing the standard of comparison. This may be collectively referred to as capacitor scaling and the circuit shown in FIG. 2 may be referred to as a capacitor scaler. Switches $SEL_1$ through $SEL_x$ may each connect to a respective plate of a capacitor, $C_1$ through $C_x$ or to ground. Capacitor matrix 200 may be powered by a voltage reference, $V_{REF}$ for the configurable voltage buffer 150. Each capacitor $C_1$ through $C_x$ has a capacitance value which, for example, may be measured in units of femto ($10^{-15}$) farads (fF). In connection with throwing selected switches, $SEL_1$ through $SEL_x$, which serve to connect a respective capacitor plate of a selected capacitor to $V_{REF}$ (the voltage reference of configurable voltage buffer 150), a reference capacitance $C_{ref}$, may be selected for the value of the effective capacitance of the capacitors of voltage buffer 150 used to hold the threshold voltage which comparator 160 uses to make voltage comparisons. A sampling capacitor (shown in FIG. 1 as 112, 114, 116, 120 or 122) and thus a sampling capacitance is associated with each voltage of interest (e.g., that associated with battery (100, 102, 104), internal die temperature 105 or battery current 107), used in voltage comparisons. For each capacitor in matrix 200, a weighted value may apply and correspond to each binary digit of an address in configuring matrix 200's capacitance (for buffer 150's output capacitance $C_{ref}$) to result in a particular threshold voltage to be used as a standard by voltage buffer 150. In this manner, voltage buffer 150 is configurable to output a range of voltages within the rail-to-rail supply voltages of buffer 150.

With reference back to FIG. 2, the total charge q, across capacitors selected by switches $SEL_1$ through $SEL_x$ in matrix 200 is $q=C_{ref}(V_{ref})$. This should be equal to the product of voltage on the chosen sampling capacitor $C_{samp}$ (that is, capacitor 112, 114, 116, 120, 122) as determined by a channel selection and the desired threshold voltage (noting that a threshold voltage is desired to be maintained for a given location (whether pertaining to a selected battery terminal, temperature die, battery current, etc.). As such, $q=C_{ref}(V_{ref})=C_{samp}*(V_1)$. The threshold voltage appearing at the output (node 180) of configurable voltage buffer 150 in FIG. 1 is therefore approximately (where the symbols indicated in Equation (1) represent values of appropriate value and units)

$$V_{th} = \frac{V_{ref} * C_{ref}}{C_{samp}}. \quad (1)$$

Equation (1) may be used to determine a threshold voltage calculation based on channel selection and sampling capacitors of a defined capacitance. Generally, the desired value for threshold voltage is known. The sampling capacitor's capacitance holding the voltage to be put under test is known and the reference voltage $V_{ref}$ into configurable voltage buffer 150 is known. It only remains to solve for $C_{ref}$ in Equation (2)

$$C_{ref} = V_{th} * C_{samp}/V_{ref} \quad (2)$$

For example, Equation (3) lists 5 channels (each channel providing an avenue for test for a particular threshold voltage) and 15 capacitor weights which can be used to scale capacitance value given that the capacitors in configurable voltage buffer 150 are in parallel and that the equivalent capacitances of selected capacitors in voltage buffer 150 add together to result in the reference capacitor value, $C_{REF}$. An exemplary capacitance value used by configurable voltage buffer 150 for each threshold voltage to be tested is listed in Equation (3) with SELCHAN referring to a parameter governing channel selection. For instance, one or more battery voltages, an internal semiconductor die temperature, a battery current, etc. are all examples of parameters that may be monitored through comparison with a corresponding threshold voltage output from configurable voltage buffer 150. For instance, with reference to FIG. 1, measurement of a voltage associated with battery current may take place in connection with selecting a voltage on channel 5 (S5). This voltage may, for instance, represent the voltage across a resistor through which a desired current of corresponding value must flow. That is, as voltage is directly proportional to current, a corresponding voltage is determinable from a particular desired current flowing through a given resistor such as resistor 124. Similarly, for current flowing through current source 111 connected to diode 119, with switch 118 interposed therebetween, a measurement of voltage across diode 119 permits the monitoring of voltage across diode 119. Equation (3) illustrates some exemplary values of capacitances for sampling, in femto Farads (fF), along with the SELCHAN number which stands for the channel number through which to test the voltage purported to hold the voltage on a sampling capacitor corresponding to that channel.

$$C_{samp} = \begin{cases} 60 \text{ } fF, & SELCHAN = 0 \\ 48 \text{ } fF, & SELCHAN = 1 \\ 36 \text{ } fF, & SELCHAN = 2 \\ 24 \text{ } fF, & SELCHAN = 3 \\ 12 \text{ } fF, & SELCHAN = 4 \end{cases} \quad (3)$$

Equation (4) shows an exemplary equation for determining $C_{ref}$ for a particular channel selection in conjunction with weighting terms SELMSB and SELLSB. Each SELMSB term in a bus may, for example, have a weight of 16 unit capacitors while each SELLSB term in a bus may have a weight of 1 unit capacitor. The SELMSB and SELLSB bus of signals may be thermometer encoded such that when the highest order signal in bus is asserted, all the lower order signals are also asserted. For example, each assertion of a SELMSB signal adds 16 additional units of capacitors to the total.

$$C_{ref}=16*(SELMSB)+1*(SELLSB) \text{ (Thermometer)} \quad (4)$$

Figure 3:
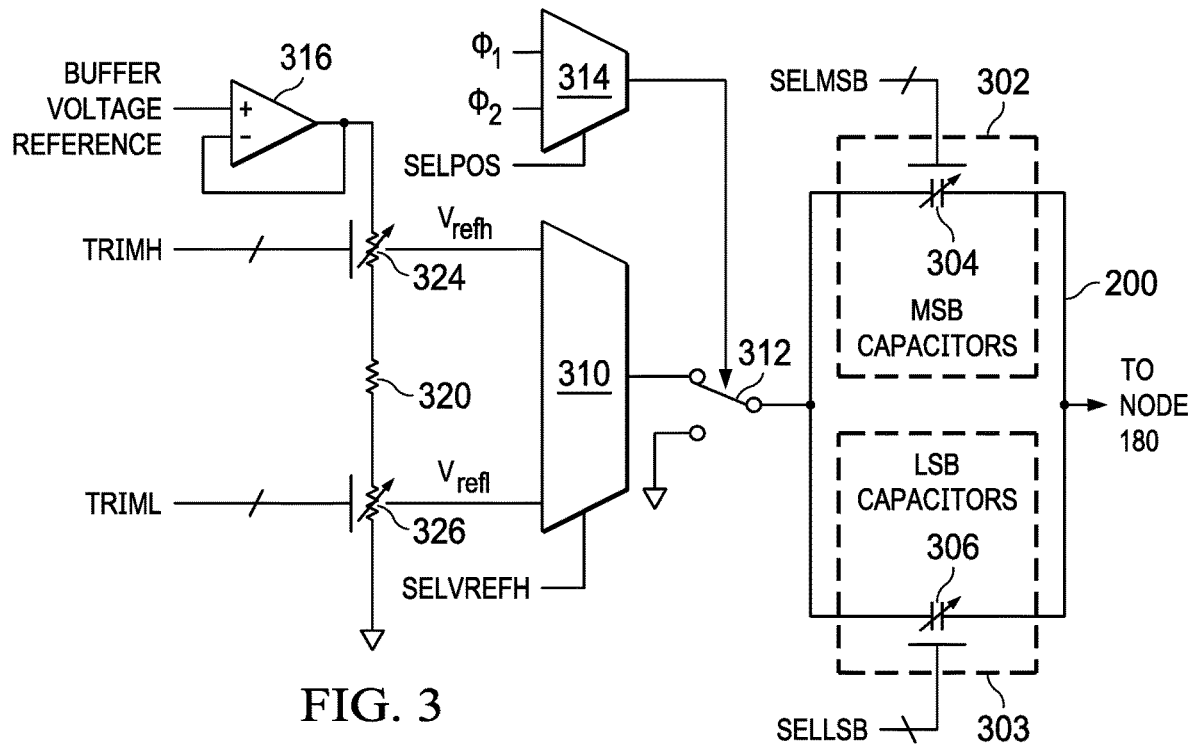
FIG. 3 illustrates a schematic drawing of the configurable voltage buffer which includes capacitor selection for determining the value of Cref.

FIG. 3 illustrates a schematic drawing of a circuit which may implement capacitor selection for determining the value of $C_{REF}$ as shown in FIG. 2. Such a circuit may be implemented in connection with a programmable logic controller (not shown). Selection of capacitors of a particular value may result in implementation of a thermometer coding for capacitors as discussed with respect to Equation (4). A portion of the circuit in FIG. 3 may be found in configurable voltage buffer 150 of FIG. 1 as implemented in block 200 of FIG. 2. Block 302 represents selection switches and their associated capacitors, as shown in FIG. 2, corresponding to the most significant bits (MSBs) of an address used to choose those associated capacitors in providing an effective $C_{REF}$, as discussed above. These capacitors collectively provide capacitance which is equivalent to that of at least part of $C_{ref}$. Block 303 represents selection switches and their associated capacitors corresponding to the least significant bits (LSBs) of an address used to choose these associated capacitors. These capacitors collectively provide capacitance equivalent to that of at least part of $C_{REF}$. Adjustable capacitor symbol 304 represents a capacitor having the effective capacitance of capacitors selected by switches $SEL_1$ through $SEL_x$, (of FIG. 2) represented by SELMSB, which corresponding to the most significant binary bits in an address used to select capacitors in the capacitor matrix 200 (FIG. 2) for $C_{ref}$, while adjustable capacitor symbol 306 represents the capacitors selected by those of switches $SEL_1$ through $SEL_x$ which corresponding to the least significant binary bits in an address used to select capacitors in capacitor matrix 200, as represented by SELLSB for selected capacitors that contribute to a given $C_{ref}$. In a manner as explained above, lines SELLSB and SELMSB control the selection of which capacitor members of capacitor matrix 200 are connected to the threshold voltage of the configurable voltage buffer 150, thereby collectively providing a reference capacitor of value $C_{ref}$ for the capacitor scaler of FIG. 2. Multiplexer 310 controls switch selection in capacitor matrix 200, in connection with switch 312, to choose the voltage output from configurable voltage buffer 150. Switch 312 may choose Vref as Vref high, (Vrefh), or Vref low (Vrefl), thereby providing at least two voltage levels to power configurable voltage buffer 150. This effectively permits testing of various thresholds with different threshold voltage requirements, such as, low voltage thresholds and high threshold voltages. Control of multiplexer 310 for the Vrefh or Vrefl levels is accomplished in connection with a control signal over line SELVREFH. The application of voltages from configurable voltage buffer 150 occurs in connection with clock signals $\Phi_1$ and $\Phi_2$ as controlled by multiplexer 314. Multiplexer 314 is controlled in connection with input SELPOS which effectively controls whether the threshold voltage being output from configurable voltage buffer 150 in FIG. 1 is positive or negative.

The buffer voltage reference for configurable voltage buffer 150 of FIG. 1 may be provided by buffer 316, shown, for example in FIG. 3, as being connected in a negative feedback mode with the output of buffer 316 being tied to the negative input of buffer 316. Control of the voltage reference may be appropriately scaled in connection with adjustable resistors 324 (for adjusting the Vref low (Vrefl) and Vref high (Vrefh) levels) and adjustable resistor 326 (for adjusting the Vrefl and Vrefh levels) as separated by resistor 320. This ensures an appropriate voltage reference for a wide variety of applications. Adjustable resistor 324 and adjustable resistor 326 allow for further tailoring of the buffer reference voltage to voltage buffer 150 in connection with the application of voltages TRIMH (high trimming voltage) and TRIML (low trimming voltage) to resistors 324 and 326, respectively. TRIMH, TRIML, SELPOS, SELVREFH, SELLMSB and SELLSB may arise through programming of non-volatile memory in a PLC (not shown).

In connection with a clock as generated by a crystal clock oscillator or electronically (internally or World clock, etc.), voltages may be compared using comparator 160 on time scheduled according to a time-division multiplexed basis. This time schedule may be referenced as a slow or fast schedule as discussed further herein. As such, voltage comparisons may be scheduled to occur periodically according to a clock over a period of time and/or one or several schedules may be carried out in connection with the voltage comparisons The schedule may be controlled, over a channel, in connection with a programmable logic controller (not shown) having registers for controlling various functionalities, such as those discussed in connection with FIG. 3.

Figure 4:
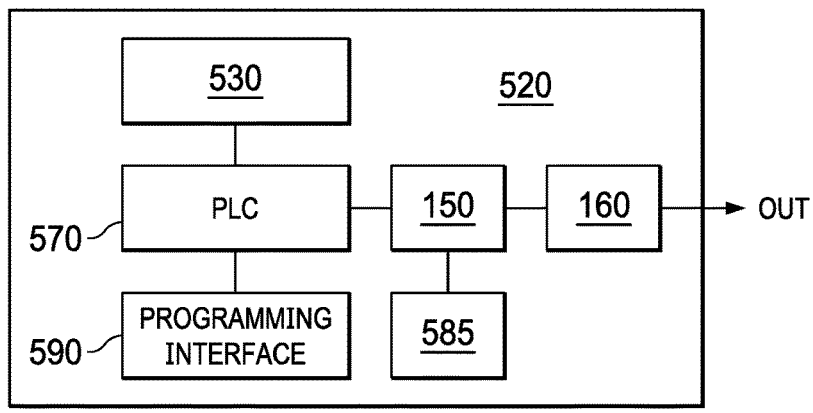
FIG. 4 is a block diagram showing the interaction of a programmable logic controller with a platform, permitting switch connections to various reference voltages.

FIG. 4 is a block diagram showing the interaction of programmable logic controller (PLC) 570 with platform 520 on which switch connections with various reference voltages may be established in order to set up various reference voltage comparisons, according to a time scheduled in accordance with clock 530, as described above. Platform 520 may represent a semiconductor substrate. User interface 590 provides a user interface to programmable logic controller 570. User Interface 590 may be a programmable user interface for programing in a schedule on PLC 570, to control analog circuits 585 (as implemented, for example, by the switches and capacitors of FIG. 1) in conjunction with configurable voltage buffer 150 and comparator 160 to carry out scheduled comparisons as described herein. This schedule may be made fully adjustable via the programming of PLC 570. The schedule may be configurable by PLC 570, through its register settings (not shown). Implementing the programmable reference voltage comparison circuit of FIG. 1 according to scheduling set by PLC 570 produces scheduling in time-division multiplexed fashion.

With PLC 570 serving in a role as a scheduler it is noted that selected register settings may be implemented during the schedule such that comparison operations occur with different register settings in effect as determined by the schedule. The schedule may be implemented continuously and on a rotational basis with some register settings occurring more frequently than others.

In one example, registers with specific register settings (as determined by one or more bits) that are in effect during a given time period, a measurement slot (also called slot), may control the functionality of the time-division multiplexed comparator herein. As such, the term, "slot register" pertains to a register with its register settings that are in effect during a given instance. Those register settings or slot settings (register settings that apply during a given slot) implemented more frequently than others may be referred to as fast slots in comparison with those register settings implemented less often which may be referred to as slow slots.

TABLE 1

Exemplary Registers for Inclusion in a Schedule Slot

SELSPEED: Selects the slow schedule or the fast schedule for a slot.
SELCHAN: Selects the input voltage measurement channel (S1, S2, S3, etc.)
SELVREFH: Selects the magnitude of the reference voltage
SELPOS: Selects whether threshold voltage is positive or negative
SELINV: Selects whether the output of the comparator is inverted
SELLSB/SELMSB: Selects the weight of the reference capacitor for coarse threshold adjustment
TRIM/TRIML: Trims Voltage Reference for the fine threshold adjustment The schedule, as noted above in TABLE 1, occurs per designated time period as determined by clock 530 whether generated by a quartz crystal oscillator, digital source or otherwise. The schedule may dictate periodic comparisons, including periods of one (one time comparison) and above. In some examples, each time slot may account for several registers which may accommodate a given number of switch designations (on or off/logic zero or logic one) as represent by digital binary bits. For instance, one slot may account for 32 bits with each register being representative of a digital bit, thereby providing 32 bits per slot. However, note that with all examples herein, registers holding fewer or greater bits may be used and each register may be organized as a single contiguous set of bits or as individual fields that are not contiguous.

Table 1 illustrates various parameters such as: threshold voltage polarity (SELPOS); comparator output polarity (SELINV); slot schedule speed (SELSPEED); input voltage measure channel (SELCHAN); reference capacitor value (SELLSB/SELMSB); voltage reference magnitude, such as the magnitude of the output voltage of buffer 316 of FIG. 3, (SELVREFH); and fine adjustment of voltage reference, such as the output voltage of buffer 316 of FIG. 3, (TRIMH/TRIML). These parameters may be controlled by the register settings of a register that may be used to configure PLC 570 (of FIG. 5) to control the underlying functions designated by the registers. Each parameter, as shown in Table 1, may occupy one or several bits in a register. Moreover, these parameters may be coded in various registers which are implemented according to a reoccurring schedule at a frequency set by a clock such as clock 530 of FIG. 4.

Figure 5:
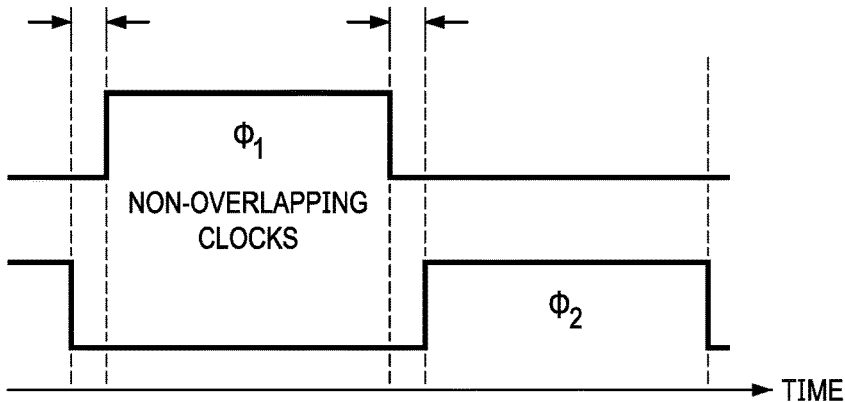
FIG. 5 is a timing diagram showing a representative graph depicting the relationship of the clock signals, $\Phi_1$ and $\Phi_2$, as a function of time.

FIG. 5 is a timing diagram showing a representative graph depicting the relationship of the clock signals, $\Phi_1$ and $\Phi_2$, described above, as a function of time. As shown in FIG. 5, clock signals $\Phi_1$ and $\Phi_2$ do not overlap. This, among other things, ensures proper comparison operations.

Figure 6:
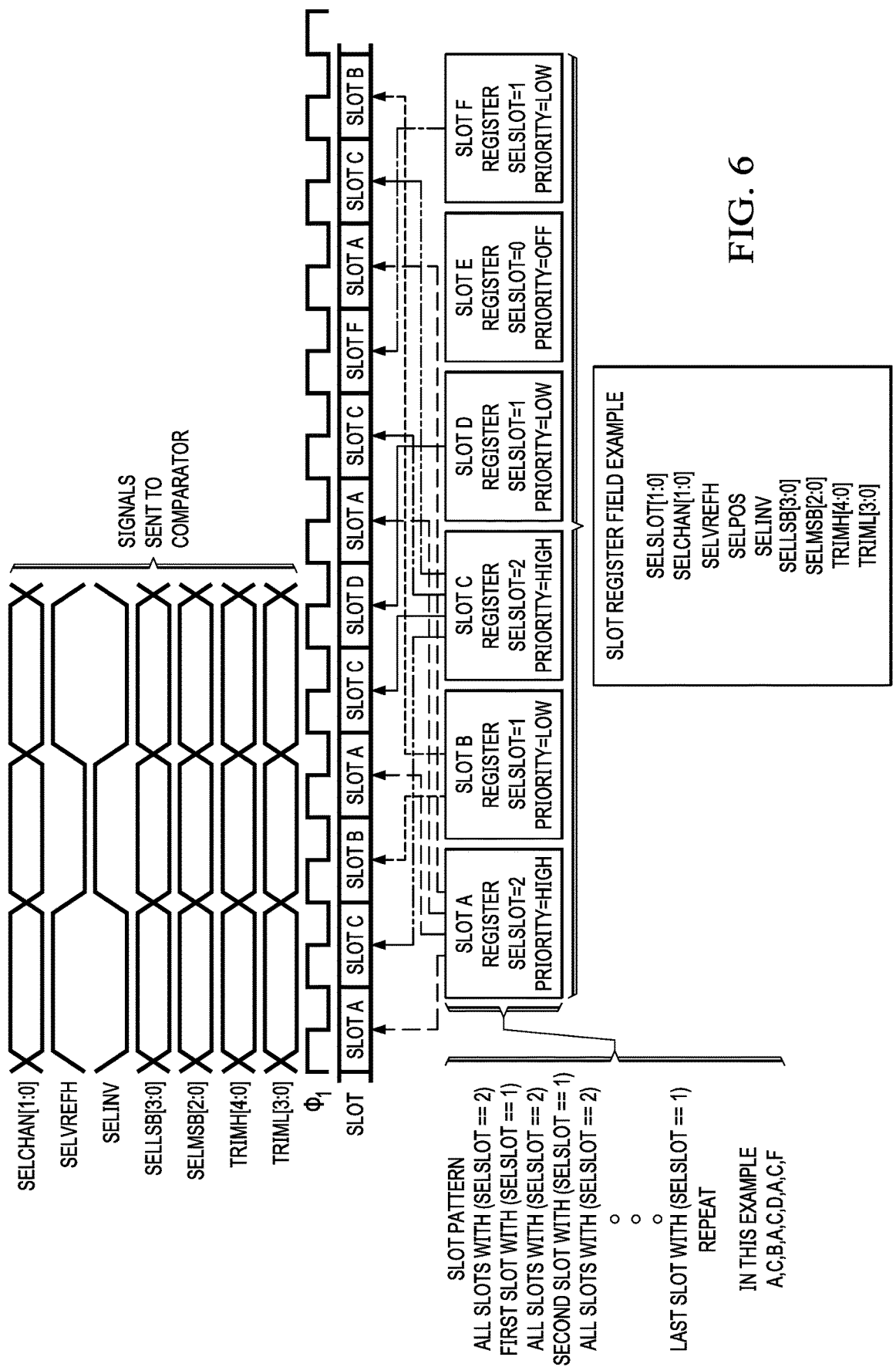
FIG. 6 illustrates a diagram of a time-division multiplexed schedule involving registers A, B, C, D, E and F.

FIG. 6 illustrates a diagram which show an example of the time-multiplexed schedule. FIG. 6 illustrates a slot schedule involving registers A, B, C, D, E and F. The schedule is shown in FIG. 6 by the series of slot indications, as implemented with clock signal $\Phi_1$, as A,C,B,A,C,D,A, C, F. Consequently, as shown in FIG. 6, register settings are loaded on a high signals/clock $\Phi_1$ pulse and during one $\Phi_1$ period, register A settings are in effect for the time division-multiplexed comparator described herein. During the next $\Phi_1$ period, register C settings are in effect for the time-division multiplexed comparator. This is followed similarly for register B followed by register A and so forth until register F, after which the schedule repeats. Note that with this example, a bit designated SELSLOT controls settings on a high priority (fast) or low priority (slow) schedules by a SELSLOT=2 or SELSLOT=1 designation, respectively.

The diagram shown in FIG. 6 depicts a scheme which implements a State Machine which uses a set of Registers to determine how to configure the comparator 160 and to store the result of the comparison. This state machine cycles through all the registers and uses information present in the registers to configure comparator 160 for each comparison cycle or slot. The comparison result is then stored for each register. In the simplest application, the state machine will cycle through each register and make the desired comparison, store the result and move to the next register. When it reaches the last register, it cycles back to the first. With this configuration the time between comparisons for a specific register/slot is deterministic and with N registers, the time between samples is N*(Comparator Clock Period). Therefore, the state machine cycles through registers and changes the comparator control signal for each Slot, saving the comparator result.

The registers, (some of which, for example, are shown in FIG. 6 as SELCHAN, SELVREFH, SELINV, SELLSB, SELMSB, TRIMH, and TRIML) may be configured so that they are skipped by the state machine and do not result in a comparison by comparator 160. As shown in FIG. 6, in this example this occurs when PRIORTY=OFF. Bit widths of the registers are indicated in brackets. Consequently, SELLSB [3:0] indicates SELLSB as having a bit width for the register of 4 bits; [2:0] following SELLMSB indicates that SELLMSB has a bit width of 3 bits; and SELCHAN [1:0] indicates a bit width of 2 bits for SELCHAN.

In some cases it is desirable to reduce the time between certain comparisons while still cycling through all of them. This is done by providing high and low priority loops. All registers that are assigned to the high priority loop are used to make consecutive comparisons, followed by a single comparison from the low priority loop. The high priority loop is then repeated before performing the next low priority comparison. The time between high and low comparisons for a specific register/slot is deterministic. If there are N=H+L+Q registers, and H=(number of high priority registers), L=(number of low priority registers), and Q=(disabled registers), then the time between high priority comparisons for a specific register/slot=(H+1)*(Comparator Clock Period). On the other hand, the time between low priority comparisons for a specific register/slot=(H+1)*L* (Comparator Clock Period).

Figure 7:
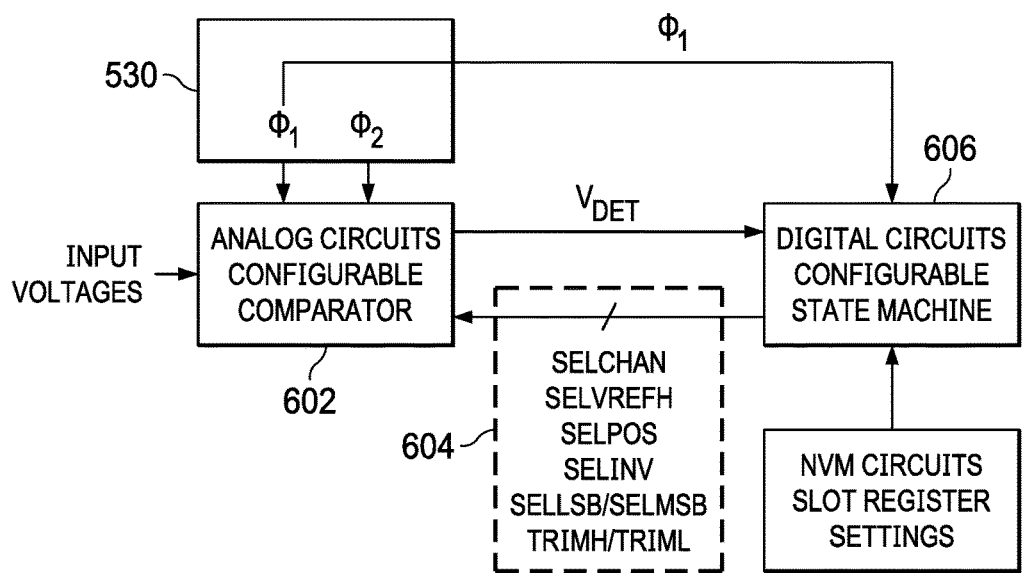
FIG. 7 illustrates a diagram showing an analog configurable comparator which interacts with digital circuits, providing a configurable state machine.

In another example, FIG. 7 illustrates a diagram showing an analog configurable comparator 602 (that provides an exemplary comparator 160 as shown in FIG. 1 and FIG. 4), for comparing input voltages (such as from a sampling capacitor and a reference voltage, as described herein) which interacts with digital circuits providing a configurable state machine 606 (as implemented, for example using PLC 570 in FIG. 4). Non-volatile (NVM) circuits 608 having registers pertaining to time slot scheduling, may be used to provide register settings for configurable machine 606. Clock 530 may be used to implement a scheduler for periodically scheduling voltage comparisons as described herein. As shown, the register settings, according to a looped schedule, for that shown in TABLE 1 may be implemented in accordance with clock signal $\Phi_1$ from clock 530. Consequently, the registers referenced in TABLE 1 may load into configurable state machine 606/PLC 570 (FIG. 4) every clock clock signal $\Phi_1$ clock period. Command plane 604 demonstrates representative commands that may be used to configure configurable comparator 602. A return feed to the configurable state machine 606 is received from comparator 602 with information determinative of the comparator outcome generated by comparator 602 in conjunction with comparator 602 receiving input voltages such as those input to comparator 160 of FIG. 1. Configurable state machine 606 may determine many monitoring parameters as configured by NVM circuits 608 holding register settings, such as those referenced in Table 1. Those register settings hold command settings for PLC 570 of FIG. 4 to control the configurable comparator 602 as configured by the analog switched capacitor functionality as described with reference to FIG. 1. Voltage $V_{DET}$ from comparator 602 may signal a corrective indication, a diagnostic, that can be used to correct insufficient or excessive voltages of a relevant voltage source. Configurable state machine 606 may serve, among other things, as a configurable scheduler in conjunction with clock signal $\Phi_1$. Comparator 602 operates in accordance with two clock signals $\Phi_1$ and $\Phi_2$, generated by clock 530, as explained above with reference to FIG. 1.

With reference back to FIG. 1, once a measurement channel is selected, among other parameters of the type listed in Table 1, during signal/clock $\Phi_1$, (caused by switch 101 being thrown accordingly) a corresponding switch (106, 108, 110, 118, 130) is thrown for a respective sampling capacitor (112, 114, 116, 118, 122) to be charged by a voltage source (100, 102, 104, the voltage across current source 111, or the voltage across resistor 124). During signal/clock $\Phi_1$, switch 101 is thrown to connect the common mode voltage (Vcm), generated by a common-mode signal generator (e.g., a battery, not shown), to the inputs of comparator 160 which are shorted together though a corresponding connection provided by switch 101. Node 180 is brought to the Vcm voltage level during signal/clock $\Phi_1$. Back plates 113b, 115b, 117b, 121b and 123b of capacitors 112, 114, 116, 118 and 122, respectively, are likewise connected to voltage Vcm during signal/clock $\Phi_1$. In connection with switch 101 being thrown to engage clock signal $\Phi_2$, comparator 160 may indicate whether the voltage output on from the configurable voltage buffer is greater, less than or equal to the voltage to a chosen sampling capacitor.

In one example, configurable voltage buffer 150 is capacitively-coupled to one back plate (113b, 115b, 117b, 121b, 12b3) of a sampling capacitor (112, 114, 116, 118, 122) in addition to being connected to the non-inverting input of comparator 160. The inverting input of the comparator is shown as being connected to a common mode voltage Vcm at $\Phi_1$, when the inputs of comparator 160 are connected together. When input of a comparator are connected (being at the same voltage potential) they may be described as being input-shorted and the procedure of connecting the inputs of a comparator to a common potential may be described as input shorting. During $\Phi_2$ the connection to the Vcm is severed, leaving the non-inverting input of comparator 160 being connected to both capacitor plate 202b of the reference capacitor Cref at the output of the configurable voltage buffer 150 (see FIG. 2) and to the back plates (113b, 115b, 117b, 12b1, 123b) of the sampling capacitors (112, 114, 116, 118, 122). Theoretically, plate 202 and a back plate (from back plates 113b, 115b, 117b, 121b and 123b) from a selected sampling capacitor would retain the charges indefinitely thereon due to the contribution of Vcm even after the Vcm connection is removed. However, in the real world, the severing of the Vcm connection results in charge dissipating from those plates. Capacitive coupling at node 180 to capacitor plate 202f of reference capacitor $C_{ref}$ and one of the front plates (113f, 115f, 117f, 121f or 123f) from a chosen sampling capacitor (112, 114, 116, 118, 122) occurs in connections with a transient state created by switch 101 changing the clock signal from $\Phi_1$ to $\Phi_2$. The voltage on node 180 moves in accordance with the greater magnitude voltage as between the voltage on a back plate (113b, 115b, 117b, 121b, 123), as controlled by ac-coupling to its respective front plate (113f, 115f, 117f, 121f, 123f) of a selected sampling capacitor (112, 114, 116, 118, 122) and the voltage on plate 202b, as controlled by ac-coupling to front plate 202f, of the effective reference capacitor 201. This transient may occur, for example, for only a few milliseconds and the move in voltage, at node 180, during the transient state occurs around the Vcm voltage point. The removal of Vcm from node 180 prompts the voltage transition at node 180 during the transient state. For instance, if there were no voltage at front plates (113f, 115f, 117f, 121f, 123f) of the sampling capacitors (112, 114, 116, 118, 122), node 180 would momentarily pull-up, during the transient state, in voltage towards the voltage at front plate 202f of capacitor 201. For cases where voltage of a greater magnitude is on a front plate of a sampling capacitor than the voltage magnitude on front plate 202f of 201, node 180 still pulls up in voltage (but to a lesser extent than the case where the front plate of the selected sampling capacitor is at zero volts). If the front plate (connected to the non-inverting input of comparator 160) of the selected sampling capacitor and front plate 202f of 201 were equal in voltage, then the voltage at node 180 would not move during the transient state. If the front plate (connected to the non-inverting input of comparator 160) of the selected sampling capacitor were greater in voltage than front plate 202f of 201, then the voltage at node 180 would move down below Vcm. The voltage of node 180 may be expected to move, for instance, between ±500 millivolts (mV) during the transient state, at which time comparator 160 compares the resulting transient voltage at the non-inverting input with the common mode voltage at the inverting input of comparator 160.

Comparator 160 will output a voltage value indicative of whether the chosen reference voltage for measurement is equal, above or below the voltage to the selected sampling capacitor coupled to a selected voltage source (100, 102, 104, 107 or 111) for comparison. The equal state in this case may be represented by a zero or null output signal from comparator 160.

The effective reference capacitor for determining the capacitance of $C_{REF}$ for configurable voltage buffer 150 is configured by the settings of SELLSBs and SELMSBs that control the capacitor matrix 200 in FIG. 2. As shown in FIG. 1 the output of comparator 160 may be exclusively ORed in exclusive OR gate 177, with SELINV to invert the corresponding logic output from comparator 160.

The programmable time-division multiplexed comparator as described herein may be implemented on an integrated circuit according to well-known semiconductor fabrication techniques. The comparator may be used in connection with monitoring battery levels on a battery pack. Alternatively, the programmable time-division multiplexed comparator may be implemented using discrete components. The comparator as described herein may be used on and/or within a wide variety of applications such as laptop computers, lawnmowers or power tools.

The foregoing has been described herein using specific examples for the purposes of illustration only. It will be readily apparent to workers in the art, however, that the principles of the herein can be embodied in other ways. Therefore, the foregoing should not be regarded as being limited in scope to the specific examples disclosed herein, but instead as being fully commensurate in scope with the following claims.

What is claimed is:

1. An apparatus comprising:
first and second measurement channels;
a comparator having a comparator input and a comparator output;
a register configured to receive first and second assignment data for the first and second measurement channels respectively; and
a control circuit coupled to the register, and configured to:
schedule first time slots for the first measurement channel based on the first assignment data and second time slots for the second measurement channel based on the second assignment data; and
periodically couple the first measurement channel to the comparator input only during the first time slots, and periodically couple the second measurement channel to the comparator input only during the second time slots, in which the first time slots are more frequent than the second time slots over a predetermined cycle.

2. The apparatus of claim 1, in which the comparator includes an analog switched capacitor comparator.

3. The apparatus of claim 1, in which the control circuit is configured to time-multiplex the first and second measurement channels for accessing the comparator input based on the first time slots and the second time slots.

4. The apparatus of claim 1, in which:
the register is configured to receive third assignment data to replace the first assignment data for the first measurement channel; and
the control circuit is configured to:
schedule third time slots for the first measurement channel based on the third assignment data; and
periodically couple the first measurement channel to the comparator input only during the third time slots.

5. The apparatus of claim 1 including:
a plurality of reference voltage terminals; and
the control circuit is configured to:
assign a first one of the plurality of reference voltage terminals for comparison with the first measurement channel during each of the first time slots based on the first assignment data; and assign a second one of the plurality of reference voltage terminals for comparison with the second measurement channel during each of the second time slots based on the second assignment data.

6. The apparatus of claim 5, in which the first one of the plurality of reference voltage terminals is different from the second one of the plurality of reference voltage terminals.

7. The apparatus of claim 1 including:
a plurality of reference voltage terminals; and
the control circuit is configured to:
assign a first one of the plurality of reference voltage terminals for comparison with the first measurement channel during a first one of the first time slots based on the first assignment data; and
assign a second one of the plurality of reference voltage terminals for comparison with the first measurement channel during a second one of the first time slots based on the first assignment data; and
the first one of the plurality of reference voltage terminals is different from the second one of the plurality of reference voltage terminals.

8. An apparatus comprising:
first and second measurement channels;
a plurality of reference voltage terminals
a switched capacitor comparator having a comparator input and a comparator output;
a register configured to receive first and second assignment data for the first and second measurement channels respectively; and
a control circuit coupled to the register, and configured to:
schedule first time slots for the first measurement channel based on the first assignment data and second time slots for the second measurement channel based on the second assignment data; and
selectively couple a first one of the plurality of reference voltage terminals to the first measurement channel at the comparator input during each of the first time slots based on the first assignment data; and
selectively couple a second one of the plurality of reference voltage terminals to the second measurement channel at the comparator input during each of the second time slots based on the first assignment data, in which the first time slots are more frequent than the second time slots over a predetermined cycle.

9. The apparatus of claim 8, in which:
the register is configured to receive third assignment data to replace the first assignment data for the first measurement channel; and
the control circuit is configured to:
schedule third time slots for the first measurement channel based on the third assignment data; and
periodically couple the first measurement channel to the comparator input only during the third time slots.

10. The apparatus of claim 8, in which the first one of the plurality of reference voltage terminals is different from the second one of the plurality of reference voltage terminals.

11. An apparatus comprising:
first and second measurement channels;
a plurality of reference voltage terminals
a switched capacitor comparator having a comparator input and a comparator output;
a register configured to receive first and second assignment data for the first and second measurement channels respectively; and
a control circuit coupled to the register, and configured to:
schedule first time slots for the first measurement channel based on the first assignment data and second time slots for the second measurement channel based on the second assignment data; and
pair, based on the first assignment data, a first one of the plurality of reference voltage terminals and the first measurement channel to the comparator input during each of the first time slots; and
pair, based on the second assignment data, a second one of the plurality of reference voltage terminals for comparison with the second measurement channel during each of the second time slots;
in which the first time slots are more frequent than the second time slots over a predetermined cycle.

12. The apparatus of claim 11, in which:
the register is configured to receive third assignment data to replace the first assignment data for the first measurement channel; and
the control circuit is configured to:
schedule third time slots for the first measurement channel based on the third assignment data; and
periodically couple the first measurement channel to the comparator input only during the third time slots.

13. The apparatus of claim 11, in which the first one of the plurality of reference voltage terminals is different from the second one of the plurality of reference voltage terminals.

* * * * *